United States Patent
Loh et al.

(10) Patent No.: US 8,344,549 B2
(45) Date of Patent: Jan. 1, 2013

(54) PHOTOVOLTAIC POWER SYSTEM

(75) Inventors: Thomas Loh, Hagen (DE); Frank Landwehr, Dortmund (DE)

(73) Assignee: Kostal Industrie Elektrik GmbH, Luedenscheid (DE)

( * ) Notice: Subject to any disclaimer, the term of this patent is extended or adjusted under 35 U.S.C. 154(b) by 478 days.

(21) Appl. No.: 12/788,441

(22) Filed: May 27, 2010

(65) Prior Publication Data
US 2011/0006609 A1    Jan. 13, 2011

(30) Foreign Application Priority Data
Jul. 9, 2009  (DE) .......................... 10 2009 032 288

(51) Int. Cl.
*H01L 31/042*    (2006.01)
(52) U.S. Cl. ........... 307/82; 136/244; 136/234; 136/293
(58) Field of Classification Search ................. 136/205, 136/206, 244; 307/82
See application file for complete search history.

(56) References Cited

U.S. PATENT DOCUMENTS
8,288,644 B2 * 10/2012  Morimoto ..................... 136/244

FOREIGN PATENT DOCUMENTS
DE    19919766 A1    11/2000
DE    10136147 A1    2/2003

* cited by examiner

Primary Examiner — Tony Ko
(74) Attorney, Agent, or Firm — Brooks Kushman P.C.

(57) ABSTRACT

A photovoltaic power system includes module strings each having photovoltaic modules connected in series. The power system further includes a generator terminal box having DC converters. The power system further includes a generator main connection line and an AC inverter. Each module string is electrically connected to a respective one of the DC converters for the module string to provide a DC voltage generated by the photovoltaic modules of the module string to the respective DC converter. The DC converters output a combined DC voltage based on the DC voltages from the module strings to the AC inverter via the generator main connection line for the AC inverter to transform the combined DC voltage into an AC voltage. The generator terminal box and the AC converter are spatially separate from one another.

11 Claims, 3 Drawing Sheets

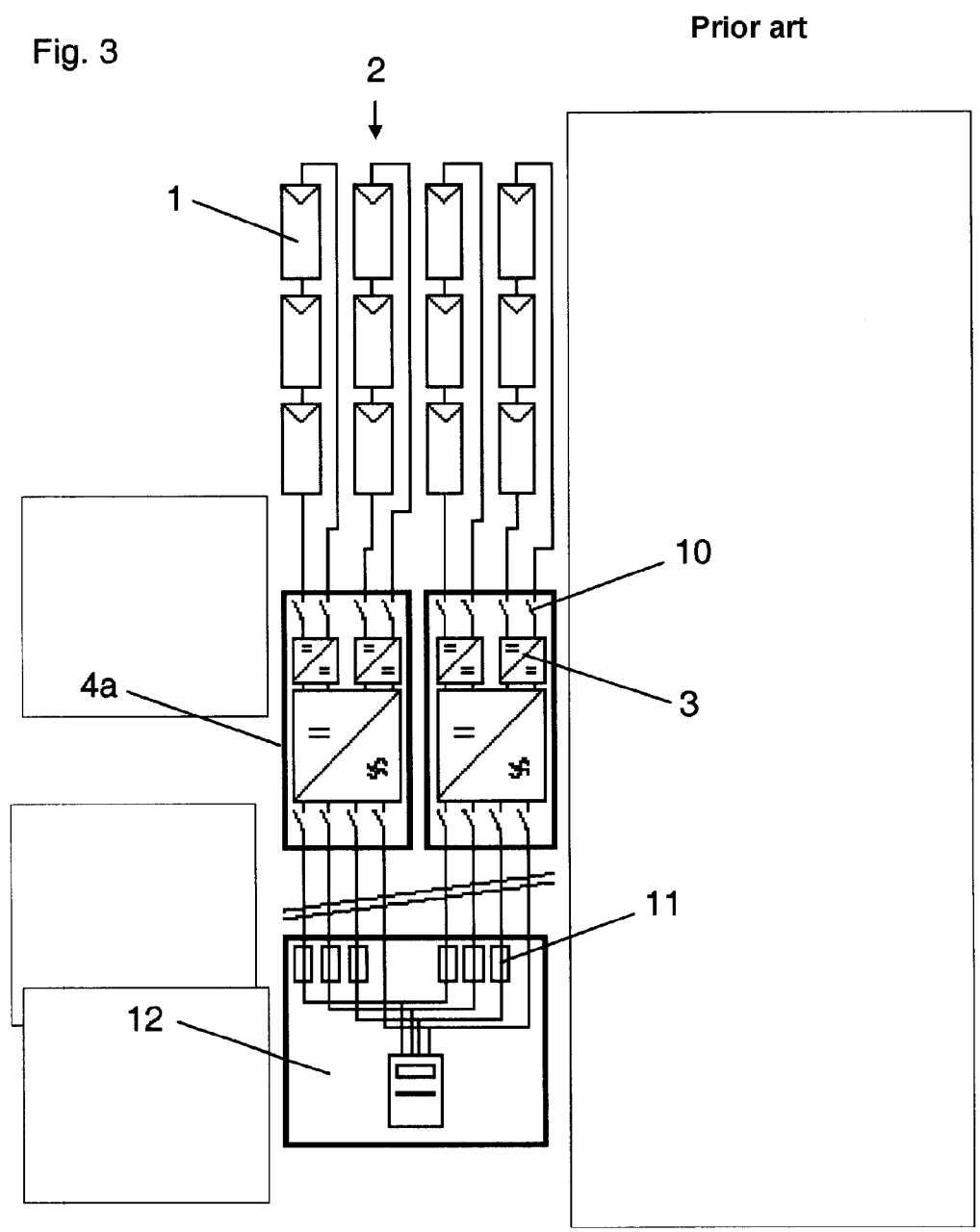

PHOTOVOLTAIC POWER SYSTEM

CROSS-REFERENCE TO RELATED APPLICATIONS

This application claims foreign priority benefits under 35 U.S.C. §119(a)-(d) to DE 10 2009 032 288.4, filed Jul. 9, 2009, which is hereby incorporated by reference in its entirety.

TECHNICAL FIELD

The present invention relates to a photovoltaic power system having module strings of photovoltaic modules connected in series in which the module strings provide their voltage outputs to respective DC voltage converters and the DC voltage converters provide their converted voltage outputs to a common AC inverter.

BACKGROUND

DE 199 19 766 A1 and DE 101 36 147 B4 describe photovoltaic power systems such as the photovoltaic power system subject of the Technical Field.

A typical photovoltaic power system includes photovoltaic modules (e.g., solar cells), DC ("direct current") voltage converters (i.e., DC/DC converters), and an AC ("alternating current") inverter. Sets of the photovoltaic modules are connected in series and form module strings. Each photovoltaic module converts sunlight into a DC voltage. Each module string generates a combined DC voltage from the DC voltages of the photovoltaic modules in the module string. The module strings provides their combined DC voltages to respective ones of the DC voltage converters. The DC voltage converters match the voltage amplitudes of the combined DC voltages with the AC inverter. The DC voltage converters output the matched combined DC voltages to the AC inverter for transformation by the AC inverter into an AC voltage. The AC voltage from the AC inverter can be fed into the network of a local energy supplier.

Larger photovoltaic power systems include a generator terminal box. Individual connection lines of the module strings are brought in the generator terminal box and connected together with a generator main connection line. The generator main connection line directly leads to an AC inverter. In addition to required connecting terminals, the generator terminal box can include string fuses, string diodes, and/or a string monitoring capability.

Typically, the DC voltage converters are designed either to be subordinate to the module strings (as indicated in DE 101 36 147 B4) or components of the AC inverter (according to the representation of DE 199 19 766 A1). As will be explained with the aid of the drawings that follow, such known arrangements have various drawbacks which are minimized by the present invention.

SUMMARY

An object of the present invention is a photovoltaic power system that is characterized by high electrical safety and low cabling cost along with simplicity and economy of construction.

In carrying out the above object and other objects, the present invention provides a photovoltaic power system having module strings each including photovoltaic modules connected in series, a generator terminal box having DC converters, a generator main connection line, and an AC inverter. Each module string is electrically connected to a respective one of the DC converters for the module string to provide a DC voltage generated by the photovoltaic modules of the module string to the respective DC converter. The DC converters output a combined DC voltage based on the DC voltages from the module strings to the AC inverter via the generator main connection line for the AC inverter to transform the combined DC voltage into an AC voltage. The generator terminal box and the AC converter are spatially separate from one another.

A photovoltaic power system in accordance with embodiments of the present invention includes photovoltaic modules that are connected to a plurality of module strings. The module strings are each connected with a subordinate DC voltage converter. The outputs of the DC voltage converters are applied to the input of a common AC inverter. The DC voltage converters are located in at least one generator terminal box which is spatially separated from the AC inverter.

In embodiments of the present invention, a photovoltaic power system includes a voltage-adjusting generator terminal box having DC voltage converters with the generator terminal box being spatially separated from a central AC inverter. The DC voltage converters are configured within the generator terminal box such that each DC voltage converter is associated with a respective module string of photovoltaic modules connected in series. The DC voltage converters provide DC voltages based on DC voltages produced by the module strings to the AC inverter for the AC inverter to convert into an AC voltage. The AC voltage may be fed into a power network. The generator terminal box, which is physically separated from the AC inverter, is placed in the most favorable spatial location with respect to the totality of the module strings. As no more than two module strings are associated with each DC voltage converter, no string fuses within the generator terminal box are needed. When only one module string is associated with each DC voltage converter, then no string diodes within the generator terminal box are needed. In alternate embodiments, the photovoltaic power system can be implemented with a plurality of spatially separated generator terminal boxes. In alternate embodiments, the DC voltage converters are designed as galvanically separating DC voltage converters.

The above features, and other features and advantages of the present invention are readily apparent from the following detailed descriptions thereof when taken in connection with the accompanying drawings.

BRIEF DESCRIPTION OF THE DRAWINGS

FIG. 3 illustrates a conventional photovoltaic power system which has a plurality of AC inverters.

DETAILED DESCRIPTION

Figure 1:
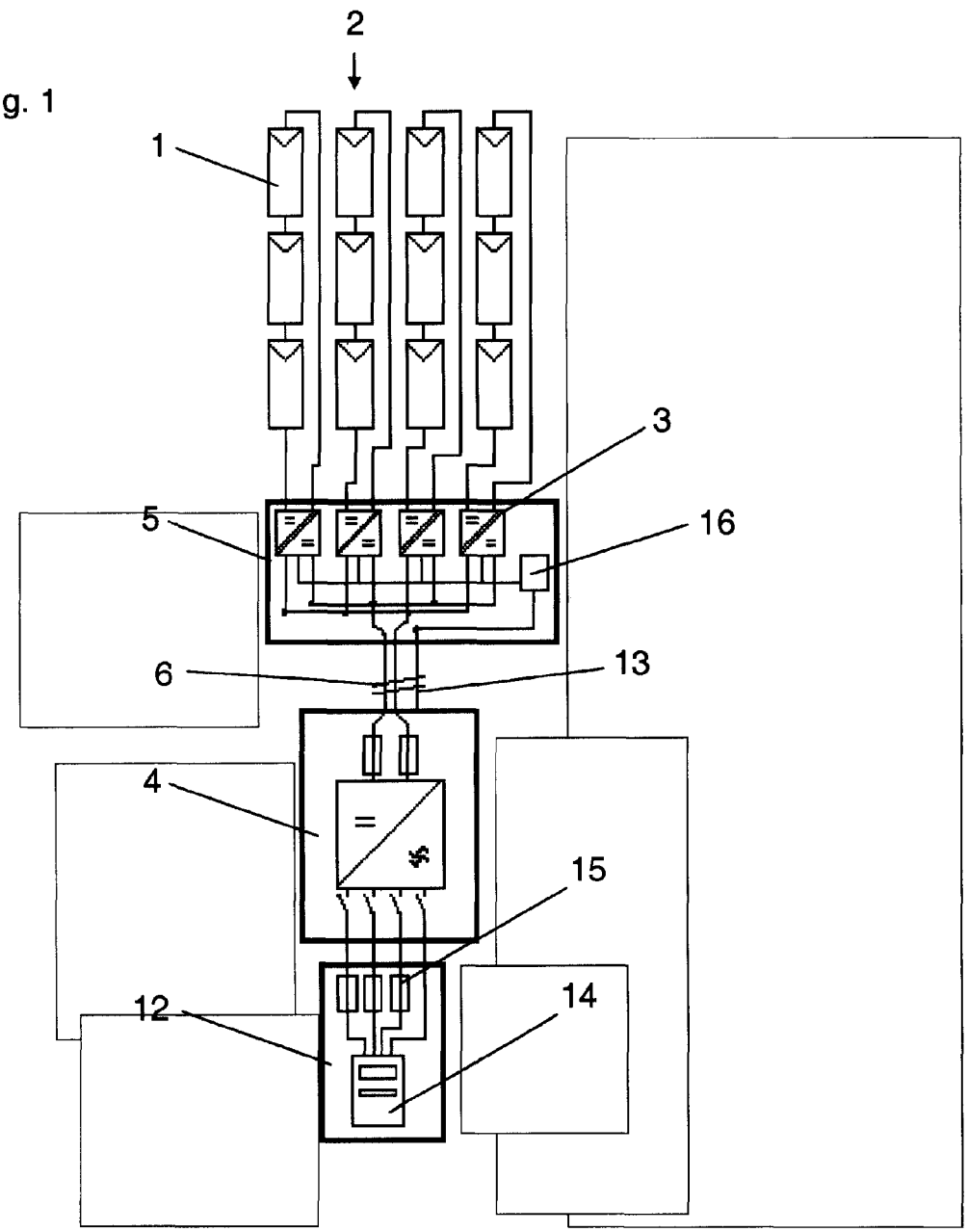
FIG. 1 illustrates a photovoltaic power system in accordance with an embodiment of the present invention in which the photovoltaic power system includes a voltage-adjusting generator terminal box.

Various embodiments of photovoltaic power systems are schematically represented in the drawings, and compared with one another with respect to their advantages and drawbacks. In the drawings, same or comparable features are indicated respectively by the same reference symbols.

Figure 2:
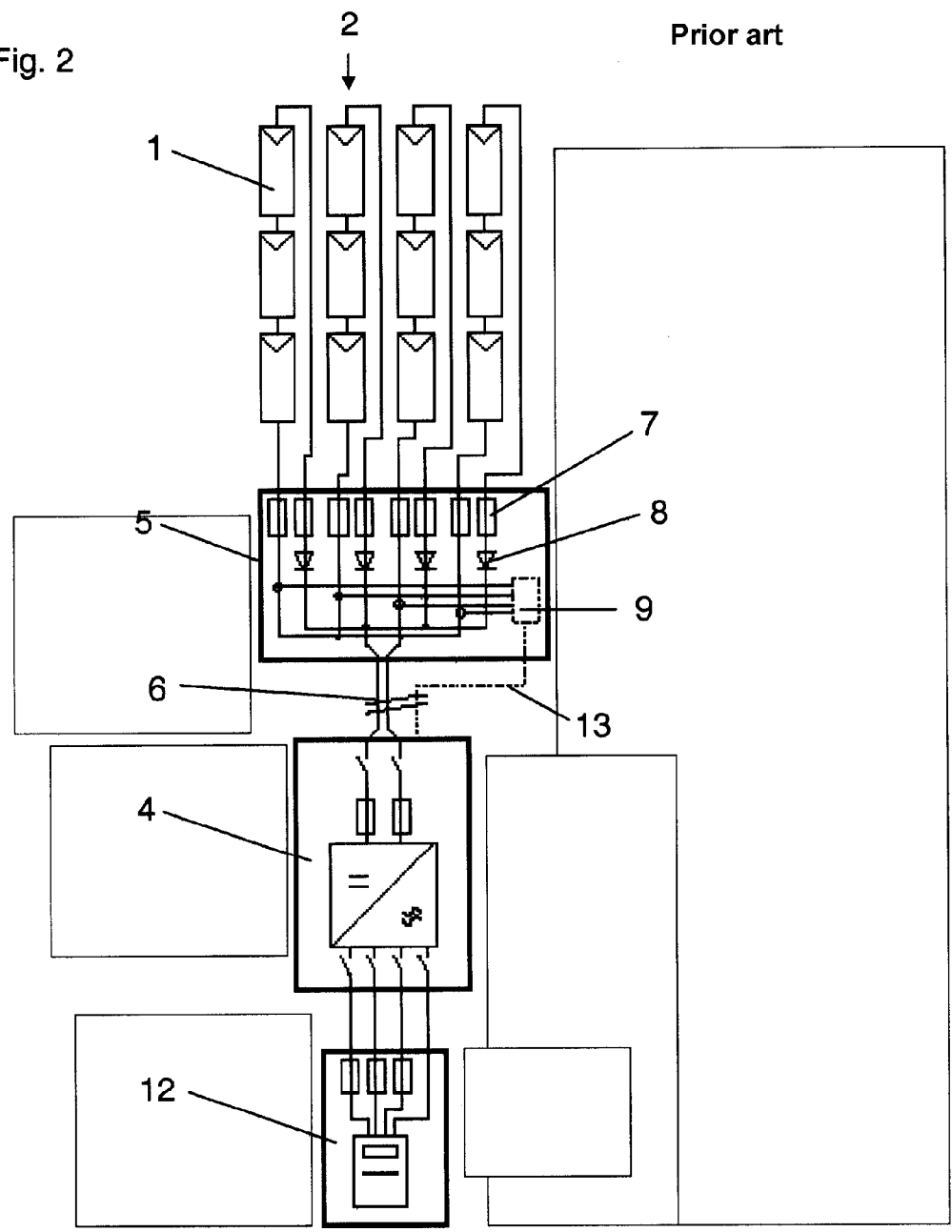
FIG. 2 illustrates a conventional photovoltaic power system which has a central AC inverter.

Referring initially to FIG. 2, a conventional photovoltaic power system having a central AC inverter 4 is shown. This power system includes a plurality of photovoltaic modules (i.e., solar cells) 1 divided into module strings 2. Each module string 2 includes distinct ones of photovoltaic modules 1 which are connected together in series. In FIG. 2, which is an example, there are four module strings 2 with each module string 2 having three photovoltaic modules 1 connected in series. Each module string 2 includes a pair of connection lines which respectively lead from the front end of the most forward photovoltaic module 1 in module string 2 and from the rear end of the most rearward photovoltaic module 1 in module string 2. The pair of connection lines of a module string 2 can be closed to form a closed circuit containing module string 2.

This power system further includes a generator terminal box 5. The connection lines of module strings 2 individually lead into generator terminal box 5 such that module strings 2 are connected in parallel to generator terminal box 5. Within generator terminal box 5, module strings 2 are brought together electrically and connected to a generator main connection line 6 which leads out of generator terminal box 5. Generator main connection line 6 is a collector cable which increases in cross-sectional area at its output end leading out from generator terminal box 5. At the output end, generator main connection line 6 is electrically connected with the input terminal of AC inverter 4.

The design of this power system allows the cabling cost and, in particular, the total length of all the lines of module strings 2 to be kept relatively short.

However, disadvantages exist due to the parallel connections of module strings 2 to generator terminal box 5. In order to assist in remedying these disadvantages, generator terminal box 5 includes string fuses 7 which are located at the input end of generator terminal box 5. A pair of string fuses 7 are respectively associated with module strings 2. The two connection lines of a module string 2 leading into generator terminal box 5 are respectively connected to the pair of string fuses 7 associated with that module string 2 as shown in FIG. 2. Due to module strings 2 being connected in parallel, string fuses 7 are present and are used in order to prevent a current from flowing in a module string 2 which becomes faulty due to a malfunction. The current is to be prevented as the current may be large enough to damage the associated photovoltaic modules and the associated cabling.

String fuses 7 are subject to special requirements as they need to interrupt current under high voltage conditions. Arcing may occur under these conditions and such arcing has to be quenched safely by string fuses 7. Otherwise, string fuses 7 themselves would represent a fire danger. Consequently, string fuses 7 are costly due to these requirements.

String fuses 7 are also subjected to a large temperature range. This makes it difficult to guarantee a triggering characteristic as each string fuse 7 has to reliably not be triggered for a rated current at high temperatures, but has to be triggered reliably at lower ambient temperatures at less than twice the rated current of the associated photovoltaic modules 1.

String fuses 7 undergo aging due to high temperature fluctuations. Such aging lowers the triggering current over the long term. The availability of a photovoltaic power system such as the power system shown in FIG. 2 is thus reduced when string fuses 7 are used. If a string monitoring system 9 (i.e., current sensors) is not used, then each string fuse 7 has to be checked individually in response to a drop in output. This is time consuming and is dangerous for maintenance personnel as this work generally occurs when voltages are present.

Generator terminal box 5 of the power system of FIG. 2 further includes string diodes 8. String diodes 8 are located within generator terminal box 5 downstream of string fuses 7 and upstream of generator main connection line 6. Each string diode 8 is respectively associated with the pair of string fuses 7 which is associated with a respective module string 2 as shown in FIG. 2. Each string diode 8 is intended to prevent a reverse current if the associated module string 2 has a lower voltage than another module string 2.

A problem is that string diodes 8 also give rise to disadvantageous properties. Their forward voltage causes a high power loss. The output of the power system is thereby reduced by approximately 0.2%. In addition, the lost power must be removed. String currents of more than 8A can be attained, especially in high power modules, which leads to a power loss on the order of 8 W per string diode 8. Consequently, string diodes 8 have to be cooled with heat sinks which entails a significant increase in cost.

In addition, string diodes 8 are exposed to voltage peaks due to nearby lightening discharges and are thus prone to failure. It is difficult to detect defects in string diodes 8. As a result, it is possible for the power system to operate for a long time at a non-optimal operating point. Further, high costs are likely to be incurred searching for the defect.

As module strings 2 are connected in parallel it can occur that a defect in one of module strings 2 may not be recognized for a long time, such as by an output monitoring system, as the output can fluctuate over a range of several percent due to various influences. This results in the power system not producing its best possible output. For this reason, current sensors 9 are placed in generator terminal box 5 to measure the individual string currents and report them to a control center (not shown). This gives rise to further complications due to the additional cabling of communication lines 13 for current sensors 9 and the costs associated therewith.

As described, generator terminal box 5 guides the connector lines of module strings 2 respectively to generator main connection line 6. As such, generator terminal box 5 is used only in photovoltaic power systems such as the power system of FIG. 2 which have a central AC inverter such as AC inverter 4.

AC inverter 4 is manufactured as a single stage unit having only one AC inverter bridge. As a result, its input voltage region is highly restricted. This leads to the fact that depending on photovoltaic modules 1 used at high module temperatures, the maximum power point ("MPP") (maximum power point=optimal operating point) voltage of the photovoltaic generator may drop below the MPP-region of AC inverter 4. Consequently, the maximum possible output is thereby no longer achieved.

A partial shading of the generator field, mismatching, or contamination can lead to individual module strings 2 not operating at their optimal point. However, AC inverter 4 has only one MPP regulator and can thus only match the voltage of the entire photovoltaic generator. This results in a lower output which is unavoidable in a parallel connection of module strings 2.

Different module technologies require grounding of one pole of the photovoltaic generator, which makes it necessary to provide central AC inverter 4 with a transformer (not shown). A transformer in these power classes represents a significant cost factor and causes a loss in output in the range of 1-2%. Such a transformer also has a relatively large weight and volume.

In the parallel circuit, only module strings 2 having the same length (i.e., the same number of photovoltaic modules 1) can be connected in parallel. This is a disadvantage, especially for photovoltaic power systems mounted on buildings, as residual areas cannot be used or the required DC cabling is more expensive because of the need to make up the required length of module strings 2.

In all, the relative massive parallel connection of module strings 2 leads to output losses and design restrictions offering too little flexibility when used with a central AC inverter such as AC inverter 4. With reference to FIG. 3, some of these drawbacks can be circumvented when a plurality of module string AC inverters are provided instead of one central AC inverter.

Referring now to FIG. 3, with continual reference to FIG. 2, a photovoltaic power system having a plurality of module string AC inverters 4a is shown. This power system further includes a plurality of DC voltage converters 3.

DC voltage converters 3 are arranged such that at least one DC voltage converter 3 is associated with a respective one of AC inverters 4a. In the configuration of FIG. 3, the power system includes two AC inverters 4a and four DC voltage converters 3. Two of the DC voltage converters 3 are associated with one AC inverter 4a and the other two DC voltage converters 3 are associated with the other AC inverter 4a. Each DC voltage converter 3 is used respectively for one to two module strings 2 to achieve voltage matching of these module strings 2 to the intermediate circuit voltage of the associated AC inverter 4a. In the configuration of FIG. 3, each DC voltage converter 3 is used respectively for just one module string 2. That is, only one module string 2 is connected to a respective DC voltage converter 3 as the four module strings 2 are respectively connected to the four DC voltage converters 3. As DC voltage converters 3 are used respectively for one to two module strings 2 in order to achieve the voltage matching, the input voltage range can thereby be significantly extended, whereby MPP-points can be achieved for smaller voltages that can occur due to partial shading of module strings 2.

String fuses 7 can be eliminated when no more than two module strings 2 are connected in parallel. As a result, the power system of FIG. 3 does not have string fuses 7. Likewise, as only one module string 2 is connected to each DC voltage converter 3 in the power system of FIG. 3, string diodes 8 can also be eliminated as DC voltage converters 3 impede reverse currents.

As a result of each DC voltage converter 3 regulating the MPP separately, information on the current and voltage is available from each module string 2. This means that additional current measurements for detecting faults are superfluous.

When module technologies are used that require grounding of a photovoltaic generator, DC voltage converters 3 are often used in AC inverters 4a that separate module strings 2 galvanically from module string AC inverters 4a. Galvanic separating DC voltage converters 3 have advantages in price, weight, and size compared to low frequency transformers which can also be used.

However, module string AC inverters 4a still have disadvantages. In most cases, module string AC inverters 4a have a relatively limited power output as the DC cabling is too costly starting at a given power rating. For this reason, module string AC inverters 4a are generally associated with no more than three DC voltage converters 3. Consequently, a relatively large number of module string AC inverters 4a are required in the design of large photovoltaic generators. If these are favorably arranged with respect to the connected module strings 2, it usually results in a higher cabling cost on the AC voltage side of module string AC inverters 4a.

In the configuration shown in FIG. 3, DC voltage isolating switches 10 are associated with the connection lines of module string 2. Each DC isolating switch 10 is located between the connection lines of a module string 2 and DC voltage converter 3 associated with that module string 2. DC isolating switches 10 are operable for connecting and disconnecting module strings 2 with the associated DC voltage converters 3. DC isolating switches 10 are provided as module strings 2 have to be able to be disconnected from module string AC inverters 4a so that in case of a faulty AC inverter 4a the associated powered-up module strings 2 can be separated therefrom. DC isolating switches 10 represent a significant cost factor for large photovoltaic power systems. In addition, line fuses 11 have to be installed in an AC switching cabinet 12 associated with AC inverters 4a. AC switching cabinet 12 serves in particular as a feed point for photovoltaic power to a distribution network.

The costs for a plurality of module string AC inverters 4a in large photovoltaic power systems are higher than the costs of a central AC inverter 4 as multiple instances of the AC inverter bridge, the housing, etc., are required.

In general, an AC inverter such as central AC inverter 4 or a module string AC inverter 4a has to be controllable by a standardized control signal for large photovoltaic power systems. The standardized control signal is decoded by a control signal receiver (not shown) and is then routed to each AC inverter 4, 4a. This is expensive for module string AC inverters 4a as either a plurality of control signal receivers are required or a signal distributing line system is needed between module string AC inverters 4a.

Another design (not shown in the drawings) is characterized by so-called module integrated converters. In this design, a DC voltage converter or an AC inverter is integrated into each photovoltaic module. This design is expensive to implement because of the use of a converter (or inverter) in each photovoltaic module, and, in any case, the efficiency is often rather low. This design can thereby not convert the advantage that each photovoltaic module is individually controlled in the MPP and shading one module does not limit the power of other photovoltaic modules to a higher overall output.

Another drawback of this design which is characterized by module integrated converters is that each photovoltaic module has to be able to communicate with a control center. Otherwise, a defective photovoltaic module cannot be located. It is also a disadvantage that the AC inverter often does not have the same lifetime as the photovoltaic module. A defect in the AC inverter of such systems requires the exchange of the entire affected photovoltaic module which significantly increases the exchange costs.

An additional expense is encountered during the installation of the photovoltaic power system. Namely, each photovoltaic module has to be identified with a serial number or the like and its position in the field has to be registered in order for defective photovoltaic modules to be able to be retrieved.

Referring now to FIG. 1, with continual reference to FIGS. 2 and 3, a photovoltaic power system in accordance with an embodiment of the present invention is shown. As indicated above, an object of this power system is, insofar as possible, to collect the advantages of the previously described established power system designs and to reduce their disadvantages. To this end, this power system includes a voltage-adjusting generator terminal box 5 having DC voltage converters 3 with generator terminal box 5 being spatially separated from a central AC inverter 4.

DC voltage converters 3 are configured within generator terminal box 5 such that each DC voltage converter 3 is associated with a respective one of module strings 2. To this end, the connection lines of each module string 2 are electrically connected to the associated DC voltage converter 3 as shown in FIG. 1. In an alternative embodiment, each DC voltage converter 3 may be associated with up to two module strings 2. As noted above, each photovoltaic module 1 converts sunlight into a DC voltage and each module string 2 produces a combined DC voltage from the DC voltages of photovoltaic modules 1 in that module string 2. Each module string 2 provides its combined DC voltage to DC voltage converter 3 associated with that module string 2. DC voltage converters 3 match the voltage amplitudes of the combined DC voltages with central AC inverter 4. DC voltage converters 3 output the matched combined DC voltages via generator main connection line 6 to central AC inverter 4 for transformation by central AC inverter 4 into an AC voltage. That is, the output voltages of all DC voltage converters 3 are collected and passed to central AC inverter 4 through connection line 6. Central AC inverter 4 is connected with an AC switching cabinet 12 for providing the AC voltage to AC switching cabinet 12. AC switching cabinet 12 may be used to feed the electrical energy produced by the photovoltaic generator (i.e., the AC voltage) into a distribution network. A component of AC switching cabinet 12 is thus at least an input counter 14.

Central AC inverter 4 and AC switching cabinet 12 can be combined into a single physical unit. An electronic control unit (not shown as an individual component) that preferentially uses a microprocessor for the photovoltaic power system is integrated into at least one of these components.

Generator terminal box 5 is physically separated from central AC inverter 4 and is preferentially placed in the most favorable spatial location with respect to the totality of module strings 2. The cabling expense can be optimized overall because the totality of the connection lines of module strings 2 can be kept as short as possible and the cabling between generator terminal box 5 and central AC inverter 4 to generator main connection line 6 and to a communications line 13 can be limited. Communications line 13 is connected to a control device 16 inside generator terminal box 5.

As a maximum of only two module strings 2 are connected per DC voltage converter 3, no string fuses are required. Because of this, significant cost savings are achieved, and in addition, the threat of danger is reduced because of less frequent required maintenance operations. The availability of the photovoltaic power system increases as there are no fuses which can melt, which would then have to be replaced.

If only one module string 2 is connected to each DC voltage converter 3 as is shown in FIG. 1, then string diodes can also be eliminated thereby achieving an improved operating efficiency. The photovoltaic power system of FIG. 1 has only a single generator terminal box 5. Alternatively, the photovoltaic power system can be implemented with a plurality of spatially separated generator terminal boxes.

The MPP is regulated individually for each module string 2 by the associated DC voltage converter 3. This enables the photovoltaic power system to achieve a particularly high output in case of partial shading or parameter scattering. The MPP region can furthermore be enlarged to the extent that the proper MPP can be approached even with partial shading. The photovoltaic generator configuration is thus essentially more flexible. In addition, not all module strings must have the same length nor use the same technology.

Measurement of the string currents by a string monitoring system that can be carried out by control device 16 can be used for MPP regulation. This enables a duplicate current measurement to be prevented which helps reduce the costs. Measurement of the string currents can still advantageously be supplemented by monitoring the string voltages. A significantly better diagnosis of each module string 2 is thereby possible by which the output can be assured.

It is particularly advantageous when the voltage in generator main connection line 6 can be increased by DC voltage converters 3 integrated into generator terminal box 5 in which case the current drops accordingly. This indicates either lower losses or that a smaller cable cross section area can be used. As the voltage here always lies above the network voltage the needed cable cross section area is in any case smaller than for the AC voltage coupling for a module string AC inverter design.

Because of the more uniform input voltage for central AC inverter 4, the components of central AC inverter 4 can be optimized with respect to the expected power loss, whereby the costs are reduced and the efficiency can be increased.

The cabling is simpler on AC voltage side of central AC inverter 4 than for a module string or multi-module string AC inverter 4a as can be seen with a comparison between FIGS. 1 and 3. Also, only one fuse set 15 is required.

It is advantageous when DC voltage converters 3 are designed as galvanically separating DC voltage converters. In this case, all module technologies can be connected to generator terminal box 5 and can be grounded in any way.

Grounding of a photovoltaic generator pole for photovoltaic power systems with string modules thereby eliminates the need for a low-frequency transformer in front of central AC inverter 4. This gives rise to a major cost reduction and avoids the electrical losses caused by the transformer.

The current can be safely suppressed by a signal from central AC inverter 4 or a control panel for galvanically separated DC voltage converters 3. When DC converter 3 is no longer controlled, generator main connection line 6 is no longer supplied with energy. If now central AC inverter 4 is cut off from the mid-voltage network, central AC inverter 4 and generator main connection line 6 are shut off from all voltage sources. An additional DC disconnection point can be eliminated in this manner. This enables not only the disconnection of central AC inverter 4, but also of generator main connection line 6 carrying the DC voltage, which runs counter to current practice.

Using a galvanically separating DC converter 3 in generator terminal box 5, module strings 2 can furthermore be switched under zero current conditions without the necessity of shutting off the entire photovoltaic power system. This reduces the output outage required for maintenance operations on individual module strings 2.

It is likewise advantageous that parts of the photovoltaic power system can also be brought on stream sequentially. This is advantageous in the design of large installations in which the expansion of a photovoltaic field can require a significant amount of time.

REFERENCE SYMBOLS

1 photovoltaic module
2 module strings
3 DC voltage converter
4, 4a AC inverter
5 generator terminal box
6 generator main connection line
7 string fuse
8 string diode
9 string monitoring (current sensors)
10 DC disconnect switch
11 line protection fuses
12 AC switching cabinet
13 communication line(s)
14 input counter
15 fuse set
16 control device As required, detailed embodiments of the present invention are disclosed herein; however, it is to be understood that the disclosed embodiments are merely exemplary of the present invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A photovoltaic power system comprising:
    a plurality of module strings, wherein each module string includes a plurality of photovoltaic modules connected in series;
    a generator terminal box having a plurality of DC converters;
    a generator main connection line; and
    an AC inverter;
    wherein each module string is electrically connected to a respective one of the DC converters for the module string to provide a DC voltage generated by the photovoltaic modules of the module string to the respective DC converter;
    wherein the DC converters output a combined DC voltage based on the DC voltages from the module strings to the AC inverter via the generator main connection line for the AC inverter to transform the combined DC voltage into an AC voltage;
    wherein the generator terminal box and the AC converter are spatially separate from one another.

2. The photovoltaic power system of claim 1 wherein:
    the DC converters separate the module strings galvanically from the AC inverter.

3. The photovoltaic power system of claim 1 further comprising:
    an AC switching cabinet, wherein the AC inverter is connected to the AC switching cabinet to provide the AC voltage to the AC switching cabinet for the AC switching cabinet to distribute to a power network.

4. The photovoltaic power system of claim 3 wherein:
    the AC switching cabinet includes an input counter.

5. The photovoltaic power system of claim 3 wherein:
    the AC inverter and the AC switching cabinet are combined into a single physical unit.

6. The photovoltaic power system of claim 1 wherein:
    each photovoltaic module is a solar cell.

7. The photovoltaic power system of claim 1 wherein:
    each module string includes a pair of connection lines which respectively lead out from the front end of the most forward photovoltaic module in the module string and from the rear end of the most rearward photovoltaic module in the module string;
    wherein the pair of connection lines of each module string are connected to the respective DC converter in order to electrically connect the module string with the respective DC converter.

8. The photovoltaic power system of claim 1 wherein:
    the connection lines of the module strings lead into the generator terminal box such that the module strings are electrically connected in parallel to one another.

9. The photovoltaic power system of claim 1 wherein:
    no more than two of the module strings are electrically connected to each DC converter.

10. The photovoltaic power system of claim 1 wherein:
    only one module string is electrically connected to each DC converter.

11. The photovoltaic power system of claim 1 wherein:
    one of the module strings includes a different number of photovoltaic modules than another one of the module strings.

* * * * *